(12) United States Patent
Inanami

(10) Patent No.: US 7,301,161 B2
(45) Date of Patent: Nov. 27, 2007

(54) METHOD OF PRODUCING ELECTRON BEAM WRITING DATA, PROGRAM OF PRODUCING ELECTRON BEAM WRITING DATA, AND ELECTRON BEAM WRITING APPARATUS

(75) Inventor: Ryoichi Inanami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 382 days.

(21) Appl. No.: 11/082,797

(22) Filed: Mar. 18, 2005

(65) Prior Publication Data
US 2005/0208772 A1    Sep. 22, 2005

(30) Foreign Application Priority Data
Mar. 19, 2004    (JP) .............................. 2004-081366

(51) Int. Cl.
*H01L 21/302* (2006.01)
(52) U.S. Cl. ............................ 250/492.22; 250/492.23; 250/492.3; 438/712; 716/21; 716/19; 430/5; 430/296; 430/30; 700/119
(58) Field of Classification Search ............... None
See application file for complete search history.

(56) References Cited

U.S. PATENT DOCUMENTS

| | | | |
|---|---|---|---|
| 6,393,604 B1 | 5/2002 | Yamada et al. | |
| 6,543,044 B2 | 4/2003 | Inanami et al. | |
| 6,756,159 B2 | 6/2004 | Inanami | |
| 6,812,474 B2 * | 11/2004 | Jolley et al. | ............ 250/492.22 |

FOREIGN PATENT DOCUMENTS

| | | |
|---|---|---|
| JP | 4-42915 | 2/1992 |
| JP | 5-241325 | 9/1993 |
| JP | 2747573 | 2/1998 |
| JP | 10-92708 | 4/1998 |
| JP | 10-154648 | 6/1998 |
| JP | 11-40482 | 2/1999 |
| JP | 2000-348084 | 12/2000 |
| JP | 2001-287223 | 9/2001 |
| JP | 3285645 | 8/2002 |

OTHER PUBLICATIONS

Notification of Reasons for Rejection issued by the Japanese Patent Office, mailed Jul. 31, 2007, in Japanese Patent Application No. 2004-081366 and English-language translation of Notification.

* cited by examiner

*Primary Examiner*—Jack I. Berman
*Assistant Examiner*—Zia R. Hashmi
(74) *Attorney, Agent, or Firm*—Finnegan, Henderson, Farabow, Garrett & Dunner, L.L.P.

(57) ABSTRACT

A method of producing electron beam writing data in which a figure cell contained in the cell-based device pattern in electron beam lithography of character projection scheme is extracted as a character pattern is disclosed. The method comprises removing an overlap of pattern data included in the figure cell, producing a character pattern cutting frame from a cell allocation frame in the figure cell, assigning a figure inside of the produced character pattern cutting frame to a pattern to be shot in a character projection scheme as a character pattern, defining a figure outside of the character pattern cutting frame as a non-character pattern, removing an overlap between an adjacent pattern and the non-character pattern, and assigning a portion of the non-character pattern, which is not overlapped on the adjacent pattern to a pattern to be shot in a variable shaping beam scheme.

20 Claims, 8 Drawing Sheets

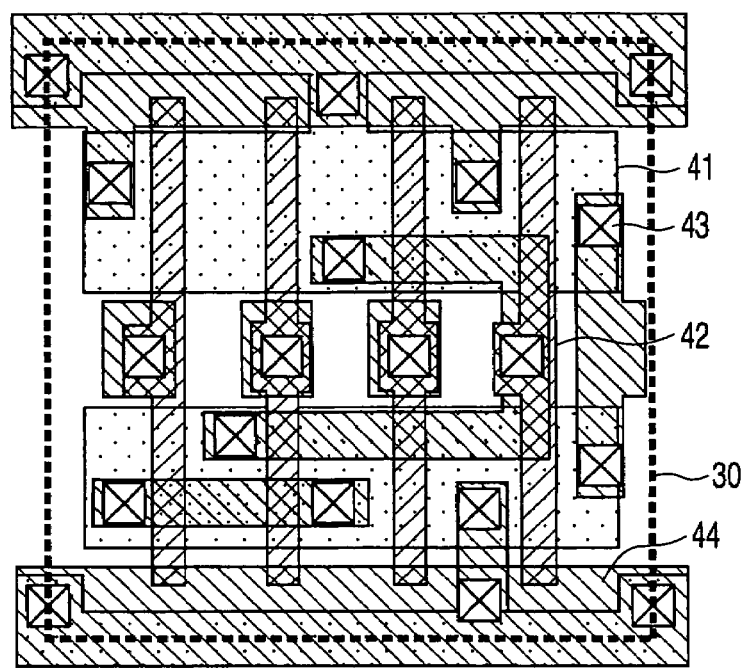
F I G. 5
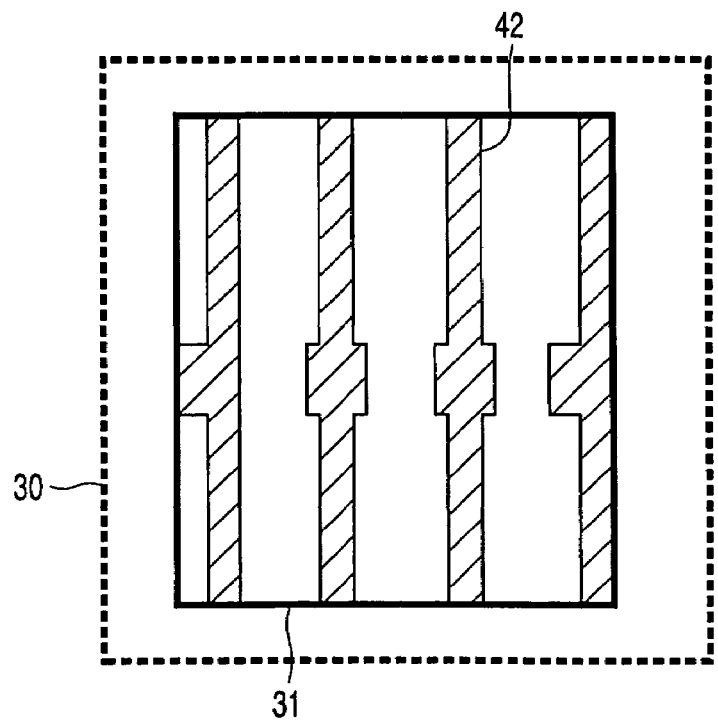
F I G. 6

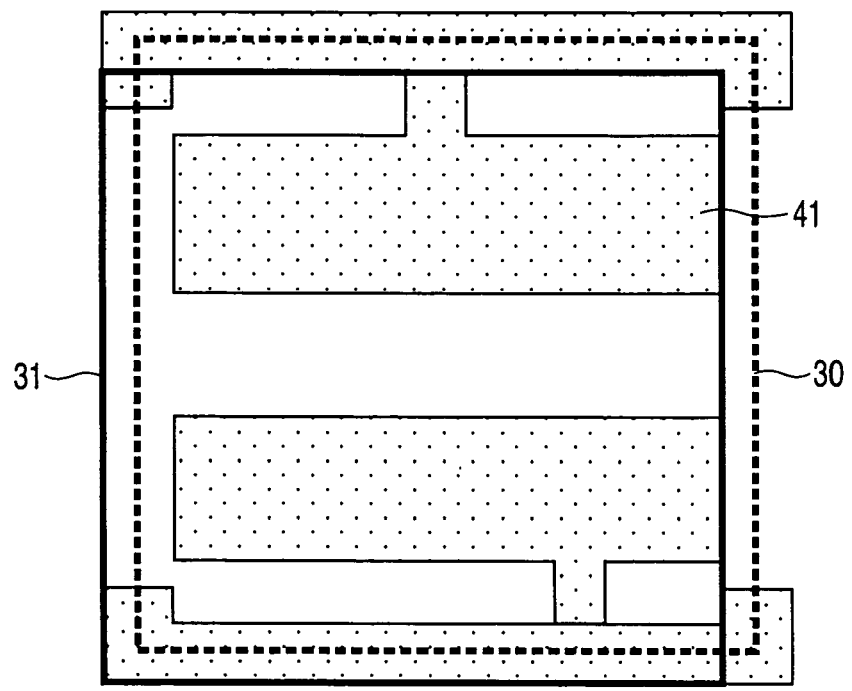
F I G. 7
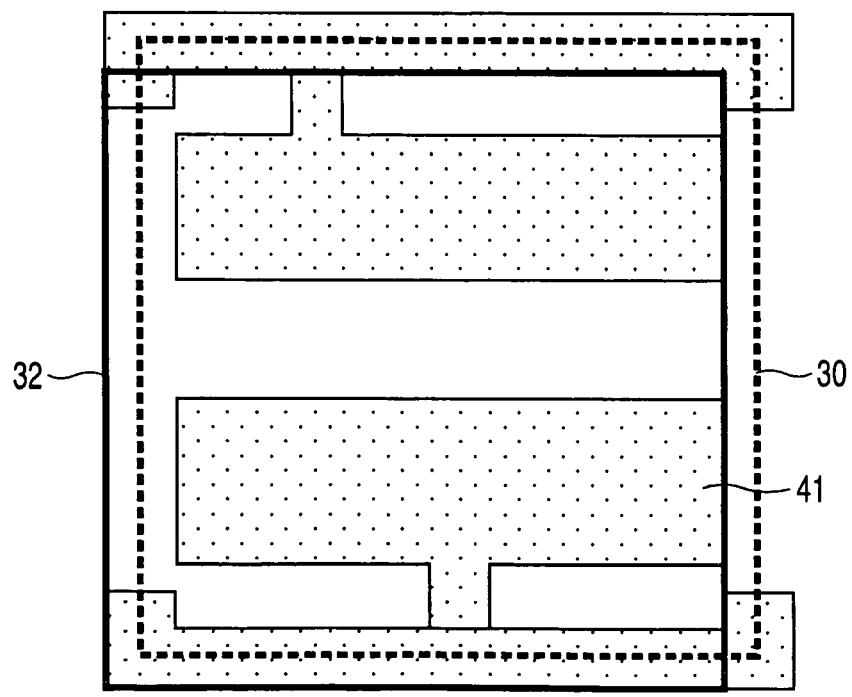
F I G. 8

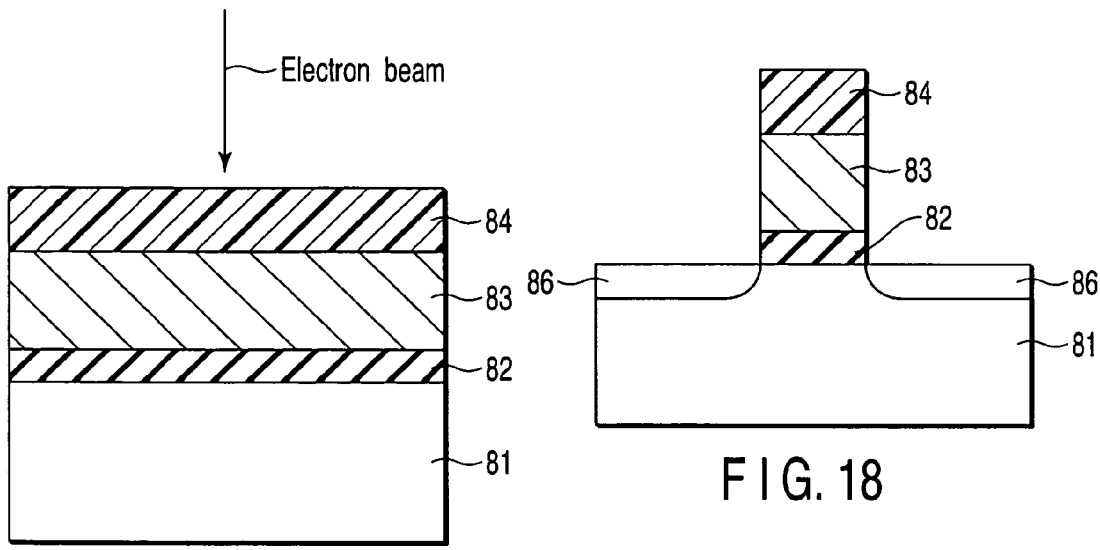
FIG. 16
FIG. 18
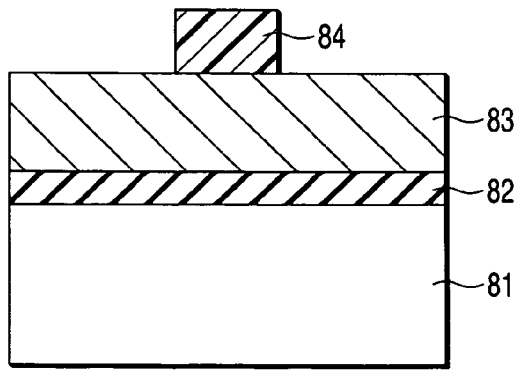
FIG. 17
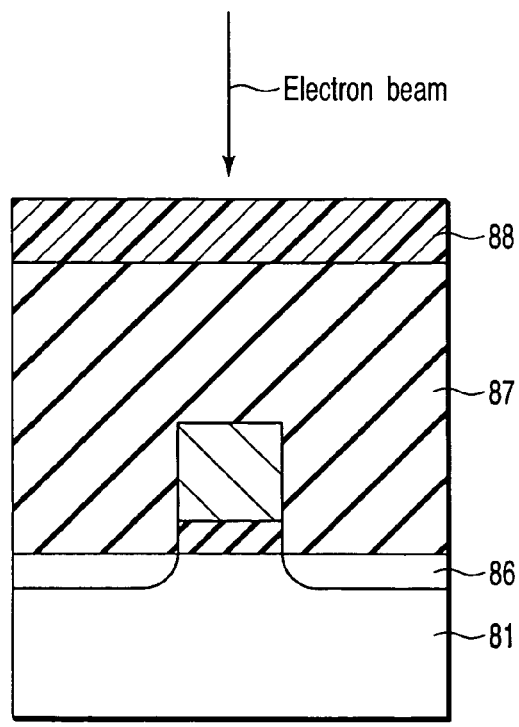
FIG. 19

METHOD OF PRODUCING ELECTRON BEAM WRITING DATA, PROGRAM OF PRODUCING ELECTRON BEAM WRITING DATA, AND ELECTRON BEAM WRITING APPARATUS

CROSS-REFERENCE TO RELATED APPLICATIONS

This application is based upon and claims the benefit of priority from prior Japanese Patent Application No. 2004-081366, filed Mar. 19, 2004, the entire contents of which are incorporated herein by reference.

BACKGROUND OF THE INVENTION

1. Field of the Invention

The present invention relates to an electron beam lithography technique of character projection scheme for writing a circuit pattern of a semiconductor device by repeatedly exposing a small shaped beam. More particularly, the invention relates to a method of producing electron beam writing data and a program of producing electron beam writing data, which have a step of writing figure cells contained in device pattern data as a character pattern. Further, the invention relates to an electron beam writing apparatus comprising a function for producing electron beam writing data described above.

2. Description of the Related Art

In manufacturing a semiconductor device, electron beam (EB) lithography is used for exposure of a fine pattern which cannot be exposed in photo lithography. Among them, an EB direct writing technique is noticeable as a method for exposing a fine pattern with QTAT and low cost without a need for providing a mask for each pattern to be exposed. Further, a character projection (CP) scheme using an opening of a pattern to be repeatedly shot can reduce the number of EB shots and can improve a writing throughput as compared with a conventional variable shaped beam (VSB). Thus, there has been searched and developed an apparatus capable of using writing in the CP method as well as the VSB method.

In the EB direct writing using the CP method, one of the most important factors includes writing a character pattern. This writing denotes extracting a repetition pattern (character pattern) from pattern data to be written and assigning the extracted pattern to a character shot.

As a method for extracting a character pattern, there is used a method for producing data obtained by removing overlap from pattern data to be written and extracting a pattern formed in the same shape which is equal to or smaller than a maximum beam size (in general, several microns in square) (refer to Japanese Patent No. 2747573, for example). Further, there is used a method for using the figure cells of pattern data for carrying out writing as a character pattern (refer to Jpn. Pat. Appln. KOKAI Publication No. 2000-348084, for example).

Such a processing operation for extracting a character pattern, in general, is often carried in for data conversion for carrying out conversion in a writing data format specific to each EB writing apparatus from a general GDSII stream that is general as a format of layout data of the semiconductor device. However, in the case where the figure cells are used as a character pattern, it is necessary to edit or correct figure data serving as a character pattern in order to prevent double exposure before carrying out a data conversion processing operation.

The editing and correction of figure data used here denotes a work of correcting a pattern so as not to overlap with other cells relevant to the pattern data contained in the figure cells serving as a character pattern, or alternatively, extracting only a portion which is not overlapped, thereby using a character pattern. It is necessary for a user to carry out such a work manually by using a figure data editor such as a CAD, requiring a large amount of inconvenience.

As described above, conventionally, in the case where the figure cells contained in the cell-based device pattern is extracted as a character pattern, it has been necessary to edit or correct the figure data serving as a character pattern in order to prevent double exposure prior to carrying out a data conversion processing operation, and this editing and correction has been very cumbersome.

BRIEF SUMMARY OF THE INVENTION

According to a first aspect of the present invention, there is provided a method of producing electron beam writing data in which a figure cell contained in cell-based device pattern in electron beam lithography of character projection scheme is extracted as a character pattern, the method comprising:

removing an overlap of pattern data included in the figure cell;

producing a character pattern cutting frame from a cell allocation frame included in the figure cell;

assigning a figure included inside of the produced character pattern cutting frame to a pattern to be shot in a character projection scheme as a character pattern;

using a figure included outside of the produced character pattern cutting frame as a non-character pattern;

removing an overlap between an adjacent pattern and the non-character pattern; and assigning a portion of the non-character pattern which is not overlapped on the adjacent pattern to a pattern to be shot in a variable shaping beam scheme.

According to a second aspect of the present invention, there is provided a program of producing electron beam writing data, which is readable and executable by a computer, in which a figure cell contained in cell-based device pattern in electron beam lithography of character projection scheme is extracted as a character pattern under the control of a computer, the program comprising:

removing an overlap of pattern data included in the figure cell;

producing a character pattern cutting frame from a cell allocation frame included in the figure cell;

assigning a figure included inside of the produced character pattern cutting frame to a pattern to be shot in a character projection scheme as a character pattern;

using a figure included outside of the produced character pattern cutting frame as a non-character pattern; and removing an overlap between an adjacent pattern and the non-character pattern; and assigning a portion of the non-character pattern which is not overlapped on the adjacent pattern to a pattern to be shot in a variable shaping beam scheme.

According to a third aspect of the present invention, there is provided an electron beam writing apparatus, in which a figure cell contained in cell-based device pattern in electron beam lithography of character projection scheme is extracted as a character pattern, for writing a desired pattern on a sample comprising:

a removing circuit which removes an overlap of pattern data included in the figure cell;

a producing circuit which produces a character pattern cutting frame from a cell allocation frame included in the figure cell;

an assigning circuit which assigns a figure included inside of the produced character pattern cutting frame to a pattern to be shot in a character projection scheme as a character pattern;

a defining circuit which defines a figure included outside of the produced character pattern cutting frame as a non-character pattern;

a removing circuit which removes an overlap between an adjacent pattern and the non-character pattern; and an assigning circuit which assigns a portion of the non-character pattern which is not overlapped on the adjacent pattern to a pattern to be shot in a variable shaping beam scheme.

According to a fourth aspect of the present invention, there is provided a method of manufacturing a semiconductor device for manufacturing a semiconductor device by using electron beam writing data produced by the method of producing electron beam writing data, as recited in the first aspect of the present invention.

According to a fifth aspect of the present invention, there is provided a method of manufacturing a semiconductor device for manufacturing a semiconductor device by using electron beam writing data produced by executing the program of producing electron beam writing data by a computer, as recited in the second aspect of the present invention.

BRIEF DESCRIPTION OF THE SEVERAL VIEWS OF THE DRAWING

FIG. 5 is a view showing an example of a layer configuration and a layout of the standard cell used in second to fourth embodiments of the invention;

FIG. 6 is a view illustrating the second embodiment, the view showing an example of producing a CP cutting frame in a gate layer;

FIG. 7 is a view illustrating the third embodiment, the view showing an example of producing a CP cutting frame in an active area layer;

FIG. 8 is a view showing an example of producing a CP cutting frame in a cell rotated by 180 degrees;

FIG. 16 is a cross sectional view showing a device structure in a step of a method of manufacturing a semiconductor device according to a fifth embodiment of the present invention, which is used to explain the manufacturing method;

FIG. 17 is a cross sectional view showing a device structure in a step following to the step in FIG. 16 of the method of manufacturing the semiconductor device according to the fifth embodiment of the present invention, which is used to explain the manufacturing method of the semiconductor device;

FIG. 18 is a cross sectional view showing a device structure in a step following to the step in FIG. 17 of the method of manufacturing the semiconductor device according to the fifth embodiment of the present invention, which is used to explain the manufacturing method of the semiconductor device;

FIG. 19 is a cross sectional view showing a device structure in a step following to the step in FIG. 18 of the method of manufacturing the semiconductor device according to the fifth embodiment of the present invention, which is used to explain the manufacturing method of the semiconductor device;

DETAILED DESCRIPTION OF THE INVENTION

Embodiments of the present invention will be described in detail by way of the accompanying drawings hereinafter.

FIRST EMBODIMENT

A first embodiment of the invention describes an electron beam writing data producing method having an operation for extracting figure cells contained in cell-based device pattern as a character pattern with respect to a contact hole pattern. A computer or a specified device may be used to carry out the writing data producing processing.

Figure 1:
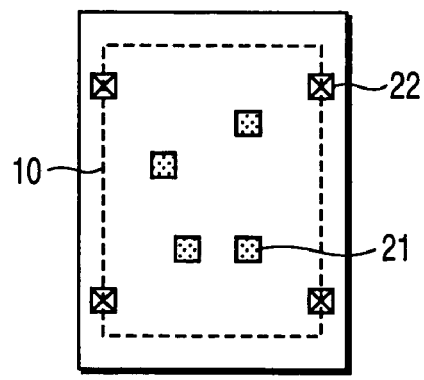
FIG. 1 is a view showing an example of standard cell used in a first embodiment of the present invention.
Figure 2:
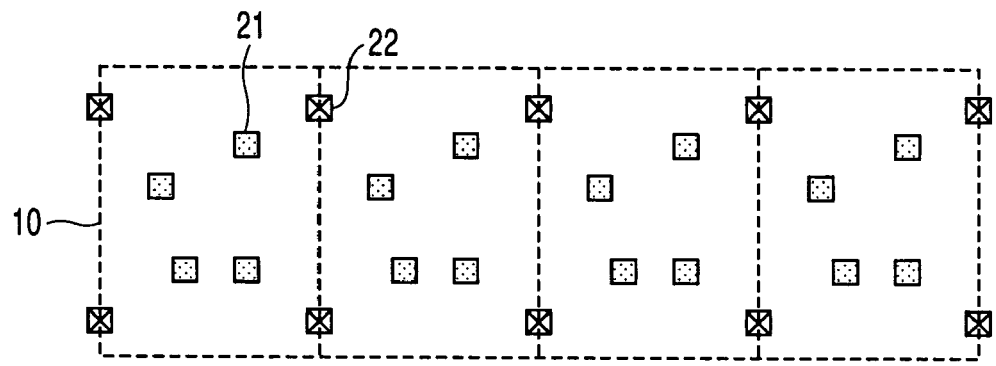
FIG. 2 is a view showing an example of allocating the standard cells of FIG. 1 in a chip.

For example, in the case where standard cells used in a logic device design are used as a character pattern, a pattern as shown in FIG. 1 is repeatedly allocated as shown in FIG. 2. At this time, cell allocation is carried out while a cell allocation frame called FRAME is defined as a standard. In FIGS. 1 and 2, reference numeral 10 denotes a cell allocation frame, and reference numeral 21 denotes a contact hole without overlap, and reference numeral 22 denotes a contact hole with an overlap.

As shown in FIG. 1, in the case where an over-lapped pattern exists in the cell allocation frame 10, if all the cells are defined as a character pattern, the adjacent patterns are overlapped as shown in FIG. 2. If writing is carried out in the CP method while a character shot is defined as it is, these patterns are doubly exposed, and thus, the dimensional precision of the patterns deteriorates.

In the present embodiment, the following processing is carried out in order to solve this problem with dual exposure.

As shown in FIG. 1, a layer defining a cell allocation frame called a FRAME layer exists in pattern data on general standard cells. This cell allocation frame is a figure defined as a standard when the standard cells, other blocks and the like are allocated in a chip in designing a device pattern layout. A layout tool optimizes the allocation and positions of the cells or blocks so that this cell allocation frame is not overlapped.

That is, in the case where the standard cells of FIG. 1 are used as a character, as shown in FIGS. 3A and 3B, a pattern of figure cells defined as a character pattern is separated inside and outside of the cell allocation frame 10 which the figure cells have, whereby, in the case where a character pattern is shot in the CP method, a pattern overlapped on another pattern or a pattern not overlapped on such another pattern can be separated from each other. In this manner, character pattern data which can be shot in the CP method can be produced so as not to be overlapped on the adjacent patterns.

Figures 3, 4:
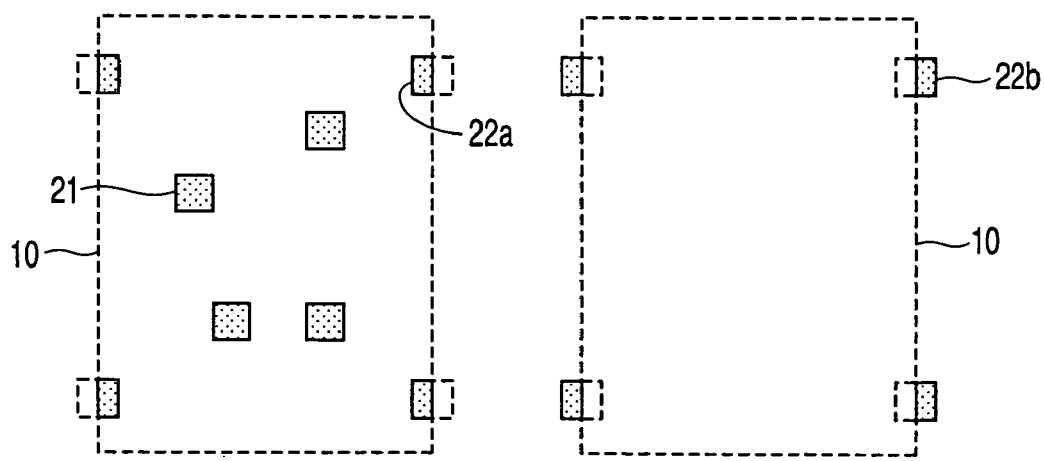
FIG. 3 is a view illustrating the first embodiment, the view showing an example of extracting a character pattern by using a cell allocation frame.
FIG. 4 is a view illustrating the first embodiment, the view showing an example of extracting a non-character pattern by using a cell allocation frame.

Reference numeral 22a shown in FIG. 3 denotes a pattern positioned inside of the cell allocation frame 10 with respect to the contact hole 22 having an overlap; and reference numeral 22b denotes a pattern positioned outside of the cell allocation frame 10.

FIG. 3 shows a character pattern, and FIG. 4 shows a non-character pattern. With respect to the non-character pattern shown in FIG. 4, in the case where the pattern is allocated in a chip as shown in FIG. 2, the following allocation of shot data is carried out in a data conversion processing operation.

When the adjacent character patterns exist, the associated overlap is investigated, and an overlapped pattern is not shot. Thus, EB shot data is not produced.

Even if the adjacent character patterns exist, in the case where a non-character pattern is not overlapped or in the case where the adjacent patterns do not exist, shooting is carried out in the VSB method.

As described above, in the embodiment, for example, in the case where standard cells are allocated in a chip as shown in FIG. 2, by carrying out separation of the character pattern such as FIGS. 3 and 4, the number of CP shots (the number of character patterns) becomes 4, and the number of VSB shots (the number of shots which are not overlapped from among the non-character patterns) becomes 4. That is, writing can be carried out in total of 8 shots without carrying out double exposure.

An electron beam writing apparatus used in the present embodiment may have any construction as long as it can use writing in the character projection scheme and writing in a variable shaping beam scheme.

The pattern contained in figure cells can be automatically separated into a character pattern and a non-character pattern in accordance with the method according to the present embodiment because a cell allocation frame which the figure cells have is utilized. Therefore, double exposure of a character pattern is prevented, thereby making it unnecessary to carry out a pattern correction work by the user's manual operation. In addition, a non-character pattern is allocated to a pattern which can be shot in another character pattern and a pattern to be shot in the VSB method, thereby making it possible to carry out EB shot which is faithful to pattern data.

From the foregoing description, the improvement of throughput and yielding can be expected by maximizing the reduction effect of the number of shots in the character projection scheme and the performance of the electron beam writing apparatus with respect to the pattern writing precision.

SECOND EMBODIMENT

Second to fourth embodiments will be described below, which relate to producing of a character pattern cutting frame from a cell allocation frame (herein-after, referred to as a CP cutting frame) relevant to maximum character pattern extracting using a cell allocation frame which figure cells have.

In the second embodiment, an increased number of characters is reduced in extracting of a character pattern according to the first embodiment.

FIG. 5 shows a layer configuration and a pattern layout of typical standard cells.

These standard cells are provided as AND/OR composite cells for carrying out computation of an output Z=(AB)+C with respect to inputs A, B, and C. In a cell-based logical device designed on a standard cells, such standard cells are allocated to an electronic circuit. The standard cells are allocated in a chip while an allocation direction such as rotation or inversion is changed. Further, an electronic circuit is configured by wiring these cells, whereby a pattern layout is produced.

In the standard cells shown in FIG. 5, in order to clarify explanation, a transistor circuit is assumed to be formed of four layers (an active area 41, a gate 42, a contact hole 42, and a metal 44). Further, these standard cells include a cell allocation frame 30 called a FRAME layer used for allocating these cells in a chip. According to the character pattern extracting method of the first embodiment, the pattern(s) contained in the cell allocation frame 30 may be extracted from among the patterns 41 to 44 of each layer in order to extract a character pattern portion from the patterns 41 to 44 of each layer shown in FIG. 5. Namely, AND computation between the patterns 41 to 44 of each layer and the cell allocation frame 30 is carried out.

For example, in the case where the gate layer pattern 42 is used as a character pattern, an AND processing operation with the cell allocation frame 30 is carried out. As a result, as shown in FIG. 6, because all the patterns are present in the cell allocation frame 30 in this case, all the patterns are assigned to a character pattern. However, the size of a character pattern is specified by the size of the cell allocation frame 30. Thus, in the case where all the patterns are included in the cell allocation frame 30, it is possible to define the size of a character to be further smaller.

In FIG. 6, a rectangle 31 (indicated by the solid line) obtained from an external shape of a pattern of a gate layer is included in the cell allocation frame 30 indicated by the broken line. In addition, an overlap portion between the external shape of the pattern and the cell allocation frame 30 is used as a CP cutting frame to newly define a pattern showing a character pattern extracting region. Namely, an AND processing operation between the externally shaped rectangle 31 and the cell allocation frame 30 of all the patterns of the gate layer is carried out, and the CP cutting frame is produced, thereby making it possible to minimize the size of extracting a character pattern.

Here, a plurality of figure AND processing operations between the cell allocation frame 30 and the gate layer pattern; between the cell allocation frame 30 and the externally shaped rectangle 31 of the gate layer pattern; and between the CP cutting frame and the gate layer pattern are carried out. These processing operations may be carried out in any order because the extracting results of a character pattern become identical to each other.

As described above, in the present embodiment, the CP cutting frame is newly produced in the AND processing operation between the pattern external shaped rectangle 31 and the cell allocation frame 30, thereby making it possible to obtain a minimum size required for shooting the character pattern extracted by the CP cutting frame in the CP method. Thus, in the case where the size of a character pattern exceeds a maximum beam size which can be shot in the CP method, it is necessary to divide the pattern into a plurality of characters. However, the size extracted as a character pattern is reduced to the minimum, thereby making it impossible to produce a wasteful character.

Here, even one figure cell is divided into a plurality of characters, whereby the number of shots increases. In addition, the number of characters includes an upper limit depending on device type, and thus, a substantial number of characters is decreased. Therefore, the method for extracting a character pattern using the CP cutting frame according to the present embodiment can reduce an increased number of characters as compared with a case of defining the size of a character pattern in accordance with the size of a cell allocation frame.

In extracting a character pattern using the CP cutting frame according to the present embodiment, even in the case where a cell allocation frame is not formed in the shape of a simple rectangle, for example, in the case where a pattern indicating a region which is not overlapped on other cells has been produced for cells which does not have a cell allocation cell in accordance with any method, a character pattern can be simply extracted in accordance with the AND processing operation between the cell allocation frame and the pattern externally shaped rectangle as described above.

THIRD EMBODIMENT

A third embodiment will be described below. Let us consider a pattern 41 of an active area layer in FIG. 5. A problem described here is that, if a pattern is separated inside and outside of a cell allocation frame 30 by the cell allocation frame indicated by the broken line of FIG. 7, an inset figures is extracted as a character pattern, and an outset figures is extracted as a non-character pattern, the shape of the non-character pattern becomes complicated, and the number of EB shots increases in the case of carrying out shooting in the VSB method. That is, there occurs a problem that a fine pattern is divided by a cell allocation frame, thereby producing a finer pattern.

Therefore, in the present embodiment, a cell allocation frame 30 of a cell figures which appears in a device pattern is moved in parallel uniform in a vertical direction and in a horizontal direction, thereby restricting a finer non-character pattern outside of the cell allocation frame and a complicated shape. This denotes that a frame 31 indicated by the solid line in FIG. 7 is used as a new CP cutting frame. It is clear that a movement quantity between a horizontal direction and a vertical direction of the cell allocation frame 30 can be used in common between the standard cells currently used because the standard cells are designed as shown in FIGS. 1 and 5. Namely, the cell allocation frame 30 of all the standard cells is uniformly moved, whereby a change in a figure overlap state between cells does not occur.

However, in the case where the standard cells of FIG. 5 are allocated in a chip by rotating or inverting them, as shown in FIG. 8, the cell allocation frame 30 is moved by the same quantity in a direction which is identical to that of another cell with respect to a layout of standard cells after rotated or inverted, thereby making it necessary to produce a CPU cutting frame 32.

It is necessary to correctly determine the movement direction and the movement quantity of the cell allocation frame 30. If an incorrect direction or value is specified, it should be noted that the shape of the non-character pattern becomes complicated or a large number of fine patterns is produced.

In FIGS. 7 and 8, in the case where non-character patterns using the CP cutting frames 31, 32 produced in the method of the present embodiment are shot in the CSB scheme, the non-character patterns are divided into a rectangular shape, and EB shot data is produced. In this case, three shots are required.

In the case where the cell allocation frame 30 is used as a CPU cutting frame as it is, six shots are required to shoot a non-character pattern in the VSB, thus making it possible to reduce the number of VSB shots.

As has been described above, in the present embodiment, the CP cutting frames 31, 32 are produced by proper movement of the cell allocation frame 30 in a horizontal direction and in a vertical direction. In this manner, as is evident from FIGS. 7 and 8, the number of shots can be reduced when a non-character pattern is shot in the VSB method, and the producing of a fine pattern can be restricted.

That is, when a character pattern cutting frame is produced, the cell allocation frame 30 is moved by a specified quantity to a specified direction, whereby the complication and fining of the non-character pattern can be restricted; and an increased number of shots and an occurrence of a fine shot can be restricted when the non-character pattern is shot in a variable shaping beam scheme. Thus, a high precision pattern can be written without deteriorating a throughput.

FOURTH EMBODIMENT

A fourth embodiment will be described below, which describes a method for extracting a character pattern, which can be applied to all general figure cells by way of example of a contact layer pattern 43 shown in FIG. 5.

With respect to patterns in this case, when a cell allocation frame 30 is used as a CP cutting frame as it is, a contact hole pattern across the cell allocation frame 30 is divided into two sections. Even if there exists a pattern having the adjacent portions serving as a non-character pattern, and it is necessary to carry out shooting in the VSB method, a contact hole may be formed to be divided depending on the shot connection precision.

Figure 9:
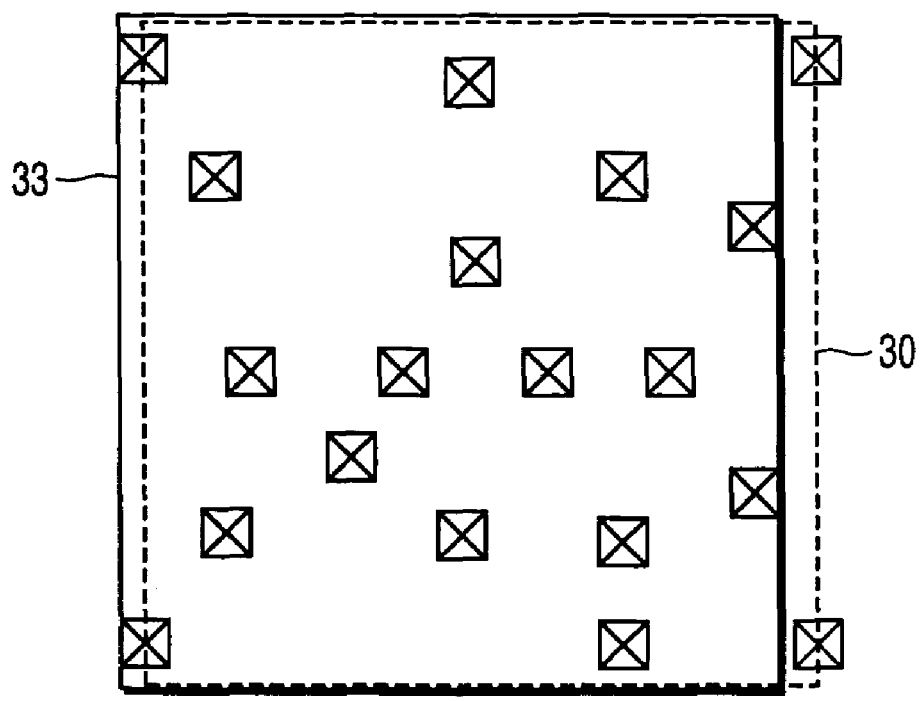
FIG. 9 is a view illustrating the fourth embodiment, the view showing an example of producing the CP cutting frame in a contact layer.
Figure 10:
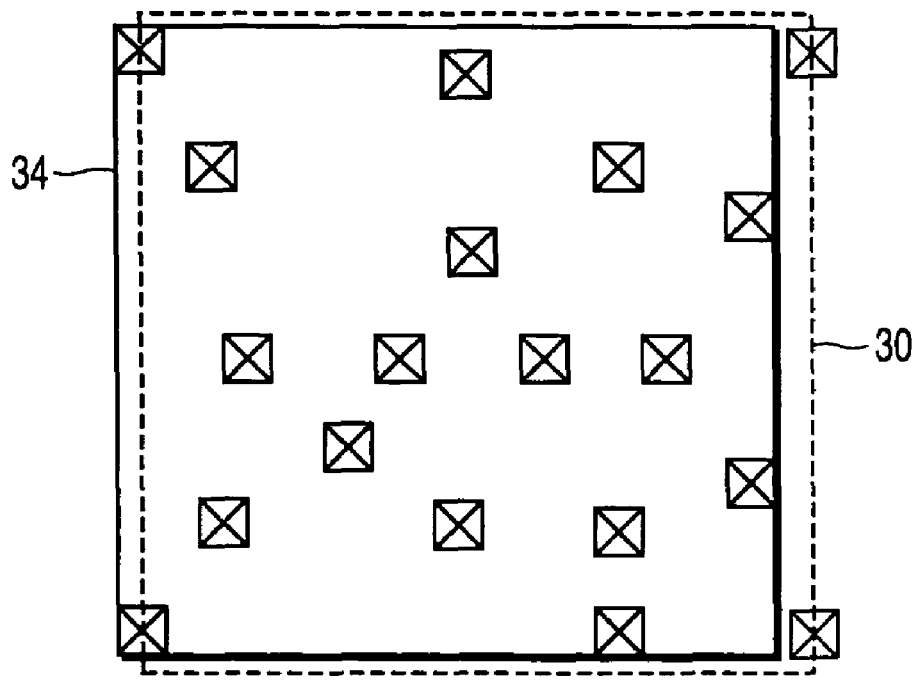
FIG. 10 is a view illustrating the fourth embodiment, the view showing an example of producing the CP cutting frame in a contact layer.

Therefore, in the present embodiment, as shown in FIG. 9, as in the third embodiment, the cell allocation frame 30 is moved in parallel by the size which is half of the contact hole in a horizontal direction, thereby restricting division of the contact hole. Further, as shown in FIG. 10, a smallest CP cutting frame 34 can be produced by carrying out an AND processing operation between a CP cutting frame 33 produced by moving the cell allocation frame 30 and an externally shaped rectangle of all the patterns of the contact layer.

Figure 11:
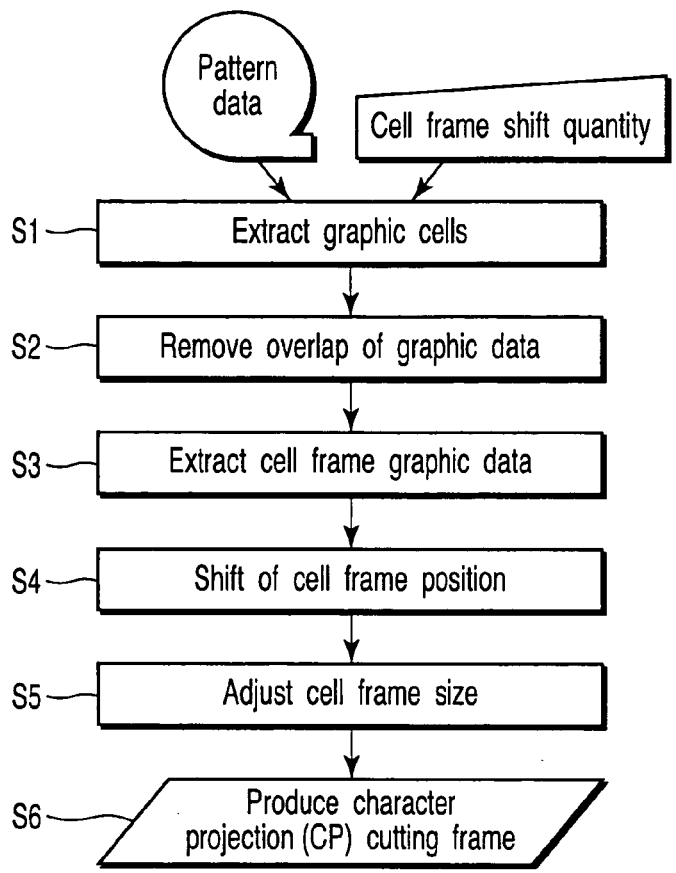
FIG. 11 is a view showing a flow of processing operation for producing the CP cutting frame.

FIG. 11 is a flow chart showing a processing operation for producing a CP cutting frame in the character pattern extracting method using the above method.

Step S1: Layout data on a device pattern for carrying out EP writing is inputted to a data conversion system, and figure cells are written. At this time, the data conversion system specifies the movement direction and movement quantity relevant to a layer in which the cell allocation frame is to be moved. Graphical cells are extracted as other characters in accordance with the presence or absence of inversion and a rotation angle in the case where the cells are rotated or inverted.

Step S2: An overlap between patterns is removed from a pattern of a sample targeted to be processed in the extracted figure cells. In the case where a plurality of cell allocation frame patterns are included, these overlapped frames are removed in the same way.

Step S3: Cell allocation frame data is extracted by reading figure information on a layer specified as a cell allocation frame pattern. The data extracted here denotes general figure data itself.

Step S4: In a movement direction of a specified cell allocation frame, the cell allocation frame is moved by a specified movement quantity, and a CP cutting frame is newly produced. As the movement direction, any one of only a horizontal direction, only a vertical direction, and both of these directions can be specified.

Step S5: An externally shaped rectangle of a pattern targeted for processing is produced, an AND processing operation with the CP cutting frame produced in step S4 is carried out, and adjustment of a cell frame size is carried out.

Step S6: The CP cutting frame adjusted in size in step S5 is used as a CP cutting frame of a pattern of a processing layer in the figure cells.

As described above, when a character pattern is extracted from the contact layer pattern shown in FIG. 5 by producing the CP cutting frame according to the present embodiment, there is no need for dividing the contact hole pattern existing on a cell allocation frame, as shown in FIG. 10, and an increased number of shots can be restricted in the case where a non-character pattern has been shoot in the VSB method. Further, when a character pattern is divided in shot size of electron beams which can be produced in the CP method, information on a minimum character pattern size is provided, thus making it possible to restrict an increased number of characters.

According to the present embodiment, by incorporating the processing operation of FIG. 11 in the data conversion system, a character pattern can be automatically extracted, and a user burden can be reduced. In addition, the produced pattern data can be restricted from being unnecessarily divided in a complicated and finely shape; an increased number of shots is restricted in the case where a non-character pattern is shot in the VSB method; and the pattern writing precision is improved. That is, equipment performance is induced to the maximum for the reduction effect of the number of shots in the CP method and the pattern writing precision, and the improvement of throughput and yield can be expected.

MODIFIED EXAMPLE

The present invention is not limited to the above-described embodiments. In the above-described embodiments, although writing data including a character pattern is produced by using an apparatus other than an electron beam writing apparatus, the writing data may be produced in a writing device by providing the writing data for carrying out the writing data producing method in the electron beam writing apparatus.

In addition, the technique described in the embodiments can be applied as a program which can be executed by a computer by writing the program in a recording medium such as a magnetic disk (such as floppy (registered trademark) disk or hard disk) or an optical disk (such as a CD-ROM or DVD), or a semiconductor memory or can be applied to a variety of apparatuses by transmitting it by a communication medium. The computer for carrying out the invention may execute the above-described processing operations by reading a program recorded in a recording medium and controlling an operation in accordance with this program.

Figure 12:
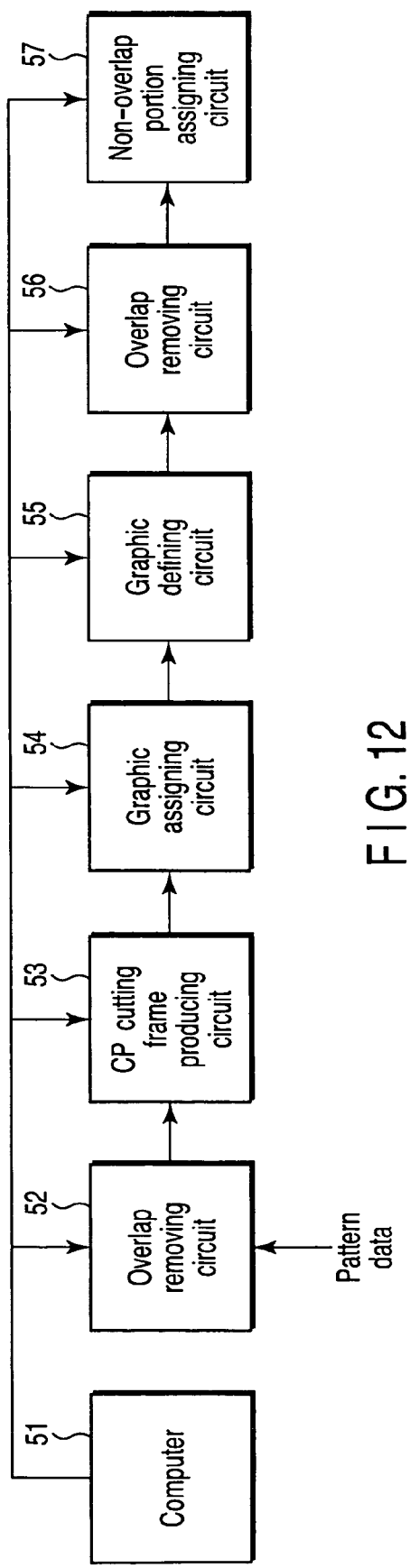
FIG. 12 is a view showing a block diagram of a data conversion section of an electron beam writing apparatus.

FIG. 12 is a view showing a block diagram of an electron beam writing apparatus. The electron beam writing apparatus writes a desired pattern on a target sample by using writing in a character projection scheme and writing in a variable shaping beam scheme. In the electron beam writing apparatus, a figure cell contained in cell-based device pattern is extracted as a character pattern. As shown in FIG. 12, the electron beam writing apparatus comprises a computer 51 for generating system control signals, a removing circuit 52 for removing an overlap of pattern data included in the figure cell, a producing circuit 53 for producing a character pattern cutting frame from a cell allocation frame included in the figure cell, an assigning circuit 54 for assigning a figure included inside of the produced character pattern cutting frame to a pattern to be shot in a character projection scheme as a character pattern, a defining circuit 55 for defining a figure included outside of the produced character pattern cutting frame as a non-character pattern, a removing circuit 56 for removing an overlap between an adjacent pattern and the non-character pattern; and an assigning circuit 57 for assigning a portion of the non-character pattern which is not overlapped on the adjacent pattern to a pattern to be shot in a variable shaping beam scheme.

Figure 13:
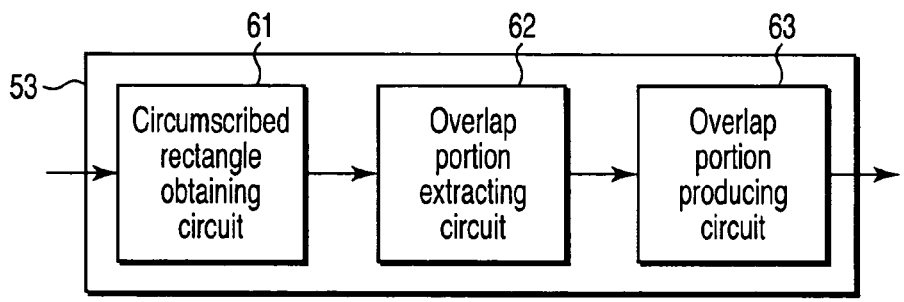
FIG. 13 is a view showing an example of a character pattern cutting frame producing circuit of the electron beam writing apparatus shown in FIG. 12.

FIG. 13 is a view showing an example of a character pattern cutting frame producing circuit 53 of the electron beam writing apparatus shown in FIG. 12. The frame producing circuit 53 comprises an obtaining circuit 61 for obtaining a circumscribed rectangle of a pattern included in the figure cells, an extracting circuit 62 for extracting an overlapped portion between a cell allocation frame and the circumscribed rectangle included in the figure cells, and a producing circuit 63 for producing the extracted overlapped portion as a character pattern cutting frame.

Figure 14:
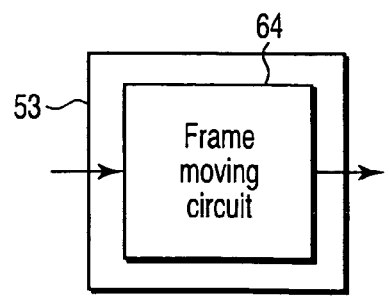
FIG. 14 is a view showing another example of a character pattern cutting frame producing circuit of the electron beam writing apparatus shown in FIG. 12.

FIG. 14 is a view showing another example of the character pattern cutting frame producing circuit 53 of the electron beam writing apparatus shown in FIG. 12. The producing circuit 53 comprises a moving circuit 64 for moving the cell allocation frame in vertical and horizontal directions by a specified quantity.

Figure 15:
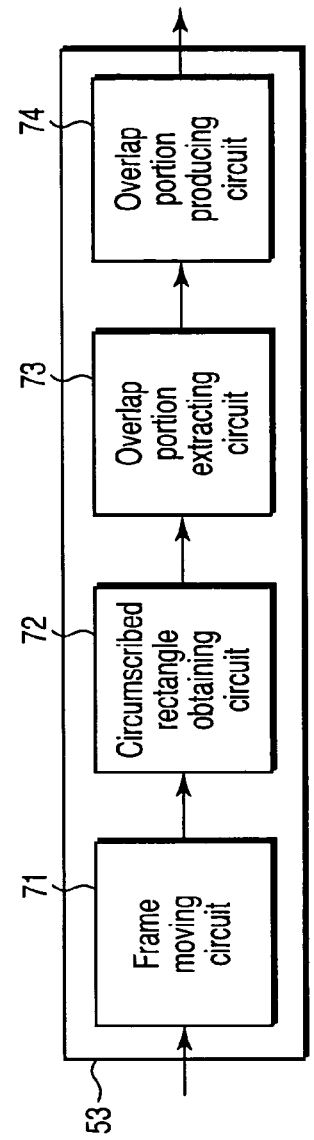
FIG. 15 is a view showing a further example of a character pattern cutting frame producing circuit of the electron beam writing apparatus shown in FIG. 12.

FIG. 15 is a view showing a further example of the character pattern cutting frame producing circuit 53 of the electron beam writing apparatus shown in FIG. 12. The producing circuit 53 comprises a moving circuit 71 for moving the cell allocation frame in vertical and horizontal directions by a specified quantity, an obtaining circuit 72 for obtaining a circumscribed rectangle of a pattern included in the figure cells, an extracting circuit 73 for extracting an overlapped portion between a cell allocation frame and the circumscribed rectangle included in the figure cells, and a producing circuit 74 for producing the extracted overlapped portion as a character pattern cutting frame.

According to the present embodiment, when figure cells are extracted as a character pattern used in direct writing electron beams in a character projection scheme, a character patter cutting frame can be automatically produced from a cell allocation frame which figure cells have. Therefore, the user's manual operation made for writing data is eliminated, and the user burden can be reduced.

In addition, in the data conversion processing operation that follows the above processing, the figure contained in the character pattern cutting frame is assigned to a character pattern, shot data is produced for carrying out shooting in the character projection scheme, an overlap of the adjacent patterns is detected for a non-character pattern, shot data is not produced in the case of such overlap, and shot data is produced in a variable shaping beam scheme in the case no overlap occurs. Thus, double pattern exposure is prevented, and a pattern can be written without deteriorating dimensional precision.

FIFTH EMBODIMENTS

Now, a description will be given with respect to a method of manufacturing a semiconductor device according to a fifth embodiment of the present invention, with reference to FIGS. 16-22.

In the method of manufacturing a semiconductor device according to this embodiment, writing data produced by the electron beam writing data producing method according to the fore-mentioned embodiments is used, and a pattern corresponding to the writing data is directly written on a semiconductor wafer by an electron beam applied thereon without via a patterning mask. In this embodiment, an MOS (Metal Oxide Semiconductor) transistor is referred to as an example of the semiconductor device.

As shown in FIG. 16, a gate insulating film 82 is formed on a silicon semiconductor substrate 81 by using a thermal oxidation method, a polysilicon film 83 is formed on the gate insulating film 82 by CVD (Chemical Vapor Deposition) method. After that, the polysilicon film 83 and the gate insulating film 82 are subjected to patterning to form a gate structure comprised of the polysilicon film 83 and the gate insulating film 82. To form this gate structure, a photo resist layer 84 is formed on the polysilicon film 83, and then the photo resist layer 84 is patterning-processed by lithography to form a photo resist pattern.

At this patterning of the photo resist layer 84, use is made of writing data produced by the electron beam writing data producing method according to the fore-mentioned embodiments, and a pattern corresponding to the writing data is directly written on the resist layer 84 by an electron beam applied thereon without via a patterning mask.

Subsequently, the written pattern is developed so that a photo resist pattern 84 corresponding to the writing data is formed, as shown in FIG. 17.

Next, as shown in FIG. 18, the polysilicon film 83 and the gate insulating film 82 are patterning-processed to form the gate structure comprised of the polysilicon film 83 and the gate insulating film 82, by using the photo resist pattern 84 as an etching mask. Then, impurities are implanted into the silicon semiconductor substrate 81 to form source/drain regions 86, by using the photo resist pattern 84, the polysilicon film 83 (polysilicon electrode) and the gate insulating film 82, as a mask.

Subsequently, the photo resist pattern 84 is removed by a known method. Then, as shown in FIG. 19, an interlayer insulating film 87 is formed over the silicon semiconductor substrate 81 by CVD method. Following this, openings are formed in the interlayer insulating film 87 for contact to the polysilicon electrode 83 and source/drain regions 86. To form the openings, a photo resist layer 88 is formed on the interlayer insulating film 87, and then the photo resist layer 88 is patterning-processed by lithography to form a photo resist pattern.

At this patterning of the photo resist layer 88, use is made of writing data produced by the electron beam writing data producing method according to the fore-mentioned embodiments, and a pattern corresponding to the writing data is directly written on the resist layer 84 by an electron beam applied thereon without via a patterning mask.

Figure 20:
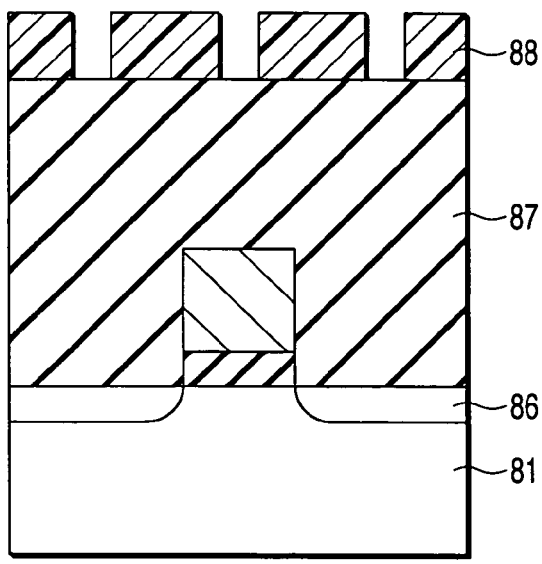
FIG. 20 is a cross sectional view showing a device structure in a step following to the step in FIG. 19 of the method of manufacturing the semiconductor device according to the fifth embodiment of the present invention, which is used to explain the manufacturing method of the semiconductor device.

Subsequently, the photo resist layer 88 is developed so that a photo resist pattern 88 corresponding to the writing data is formed, as shown in FIG. 20.

Figure 21:
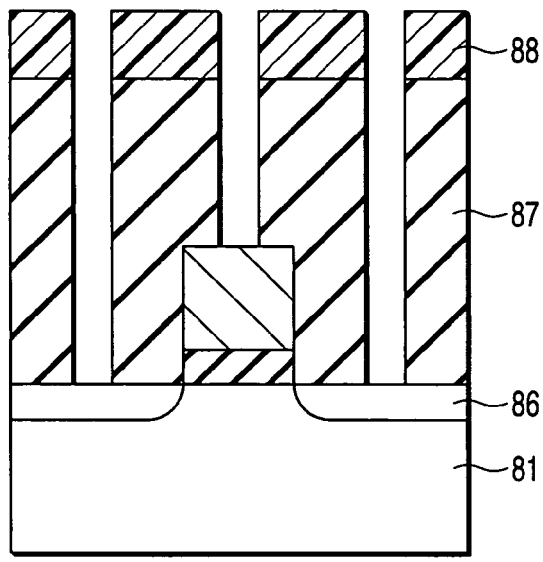
FIG. 21 is a cross sectional view showing a device structure in a step following to the step in FIG. 20 of the method of manufacturing the semiconductor device according to the fifth embodiment of the present invention, which is used to explain the manufacturing method of the semiconductor device.

Next, as shown in FIG. 21, the interlayer insulating film 87 is patterning-processed to form the openings for contact to the polysilicon electrode 83 and source/drain regions 86, by using the photo resist pattern 88 as an etching mask.

Figure 22:
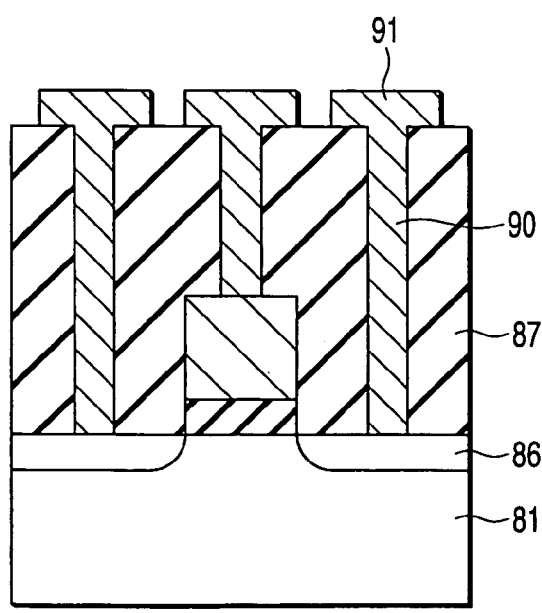
FIG. 22 is a cross sectional view showing a device structure in a step following to the step in FIG. 21 of the method of manufacturing the semiconductor device according to the fifth embodiment of the present invention, which is used to explain the manufacturing method of the semiconductor device.

Subsequently, the photo resist pattern 88 is removed by a known method. Then, as shown in FIG. 22, contact metals 90 are formed in the openings for contact to the polysilicon electrode 83 and source/drain regions 86, and wiring metals 91 contacting the contact metals 89 are formed on the interlayer insulating film 87 by a known method.

In this embodiment, in each patterning process, writing data produced by the electron beam writing data producing method according to the fore-mentioned embodiments is used, and a pattern corresponding to the writing data is directly written on a semiconductor wafer by an electron beam applied thereon without via a patterning mask. Accordingly, the formed pattern has high precision, and the semiconductor device thus manufactured has also high precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of producing electron beam writing data in which a figure cell contained in cell-based device pattern in electron beam lithography of character projection scheme is extracted as a character pattern, the method comprising:

removing an overlap of pattern data included in the figure cell;

producing a character pattern cutting frame from a cell allocation frame included in the figure cell;

assigning a figure included inside of the produced character pattern cutting frame to a pattern to be shot in a character projection scheme as a character pattern;

defining a figure included outside of the produced character pattern cutting frame as a non-character pattern;

removing an overlap between an adjacent pattern and the non-character pattern; and assigning a portion of the non-character pattern which is not overlapped on the adjacent pattern to a pattern to be shot in a variable shaping beam scheme.

2. A method of producing electron beam writing data, according to claim 1, wherein producing the character pattern cutting frame comprises obtaining a circumscribed rectangle of a pattern included in the figure cells, extracting an overlapped portion between a cell allocation frame and the circumscribed rectangle included in the figure cells, and producing the extracted overlapped portion as a character pattern cutting frame.

3. A method of producing electron beam writing data, according to claim 1, wherein producing the character pattern cutting frame comprises moving the cell allocation frame in vertical and horizontal directions by a specified quantity.

4. A method of producing electron beam writing data, according to claim 1, wherein producing the character pattern cutting frame comprises moving the cell allocation frame in vertical and horizontal directions by a specified quantity, thereafter, obtaining a circumscribed rectangle of a pattern included in the figure cells, extracting an overlapped portion between a cell allocation frame and the circumscribed rectangle included in the figure cells, and producing the extracted overlapped portion as a character pattern cutting frame.

5. A method of producing electron beam writing data, according to claim 1, wherein the cell allocation frame is a figure defined as a standard when at least a standard cell is allocated in designing a device pattern layout.

6. A program of producing electron beam writing data, which is readable and executable by a computer, in which a figure cell contained in cell-based device pattern in electron beam lithography of character projection scheme is extracted as a character pattern under the control of a computer, the program comprising:
    removing an overlap of pattern data included in the figure cell;
    producing a character pattern cutting frame from a cell allocation frame included in the figure cell;
    assigning a figure included inside of the produced character pattern cutting frame to a pattern to be shot in a character projection scheme as a character pattern;
    using a figure included outside of the produced character pattern cutting frame as a non-character pattern; and
    removing an overlap between an adjacent pattern and the non-character pattern; and
    assigning a portion of the non-character pattern which is not overlapped on the adjacent pattern to a pattern to be shot in a variable shaping beam scheme.

7. A program of producing electron beam writing data, according to claim 6, wherein producing the character pattern cutting frame comprises obtaining a circumscribed rectangle of a pattern included in the figure cells, extracting an overlapped portion between a cell allocation frame and the circumscribed rectangle included in the figure cells, and producing the extracted overlapped portion as a character pattern cutting frame.

8. A program of producing electron beam writing data, according to claim 6, wherein producing the character pattern cutting frame comprises moving the cell allocation frame in vertical and horizontal directions by a specified quantity.

9. A program of producing electron beam writing data, according to claim 6, wherein producing the character pattern cutting frame comprises moving the cell allocation frame in vertical and horizontal directions by a specified quantity, thereafter, obtaining a circumscribed rectangle of a pattern included in the figure cells, extracting an overlapped portion between a cell allocation frame and the circumscribed rectangle included in the figure cells, and producing the extracted overlapped portion as a character pattern cutting frame.

10. A program of producing electron beam writing data, according to claim 6, wherein the cell allocation frame is a figure defined as a standard when at least a standard cell is allocated in designing a device pattern layout.

11. An electron beam writing apparatus, in which a figure cell contained in cell-based device pattern is extracted as a character pattern, for writing a desired pattern on a sample by using writing in a character projection scheme and writing in a variable shaping beam scheme, comprising:
    a removing circuit which removes an overlap of pattern data included in the figure cell;
    a producing circuit which produces a character pattern cutting frame from a cell allocation frame included in the figure cell;
    an assigning circuit which assigns a figure included inside of the produced character pattern cutting frame to a pattern to be shot in a character projection scheme as a character pattern;
    a defining circuit which defines a figure included outside of the produced character pattern cutting frame as a non-character pattern;
    a removing circuit which removes an overlap between an adjacent pattern and the non-character pattern; and
    an assigning circuit which assigns a portion of the non-character pattern which is not overlapped on the adjacent pattern to a pattern to be shot in a variable shaping beam scheme.

12. An electron beam writing apparatus, according to claim 11, wherein the producing circuit comprises an obtaining circuit which obtains a circumscribed rectangle of a pattern included in the figure cells, an extracting circuit which extracts an overlapped portion between a cell allocation frame and the circumscribed rectangle included in the figure cells, and a producing circuit which produces the extracted overlapped portion as a character pattern cutting frame.

13. An electron beam writing apparatus, according to claim 11, wherein the producing circuit comprises a moving circuit which moves the cell allocation frame in vertical and horizontal directions by a specified quantity.

14. An electron beam writing apparatus, according to claim 11, wherein the producing circuit comprises a moving circuit which moves the cell allocation frame in vertical and horizontal directions by a specified quantity, an obtaining circuit which obtains a circumscribed rectangle of a pattern included in the figure cells, an extracting circuit which extracts an overlapped portion between a cell allocation frame and the circumscribed rectangle included in the figure cells, and a producing circuit which produces the extracted overlapped portion as a character pattern cutting frame.

15. An electron beam writing apparatus, according to claim 11, wherein the cell allocation frame is a figure defined as a standard when at least a standard cell is allocated in designing a device pattern layout.

16. A method of manufacturing a semiconductor device for manufacturing a semiconductor device by using electron beam writing data produced by the method of producing electron beam writing data, claimed in claim 1.

17. A method of manufacturing a semiconductor device for manufacturing a semiconductor device by using electron beam writing data produced by the method of producing electron beam writing data, claimed in claim 2.

18. A method of manufacturing a semiconductor device for manufacturing a semiconductor device by using electron beam writing data produced by the method of producing electron beam writing data, claimed in claim 3.

19. A method of manufacturing a semiconductor device for manufacturing a semiconductor device by using electron beam writing data produced by the method of producing electron beam writing data, claimed in claim 4.

20. A method of manufacturing a semiconductor device for manufacturing a semiconductor device by using electron beam writing data produced by executing the program of producing electron beam writing data by a computer, claimed in claim 6.

* * * * *